US007689952B2

(12) United States Patent
McConaghy et al.

(10) Patent No.: US 7,689,952 B2
(45) Date of Patent: Mar. 30, 2010

(54) SYSTEM AND METHOD FOR DETERMINING AND VISUALIZING TRADEOFFS BETWEEN YIELD AND PERFORMANCE IN ELECTRICAL CIRCUIT DESIGNS

(75) Inventors: Trent Lorne McConaghy, Beatty (CA); Charles Cazabon, Regina (CA); Jiandong Ge, Saskatoon (CA); Shawn Rusaw, Saskatoon (CA); Kristopher Breen, Saskatoon (CA); Jason Coutu, Saskatoon (CA)

(73) Assignee: Solido Design Automation Inc., Saskatoon, Saskatchewan (CA)

( * ) Notice: Subject to any disclaimer, the term of this patent is extended or adjusted under 35 U.S.C. 154(b) by 206 days.

(21) Appl. No.: 11/780,085

(22) Filed: Jul. 19, 2007

(65) Prior Publication Data

US 2008/0022239 A1 Jan. 24, 2008

Related U.S. Application Data

(60) Provisional application No. 60/807,893, filed on Jul. 20, 2006.

(51) Int. Cl.
*G06F 17/50* (2006.01)
(52) U.S. Cl. ............ 716/5; 716/4; 716/6; 716/18; 703/13; 703/14
(58) Field of Classification Search ............ 716/1–6, 716/18; 703/13–22
See application file for complete search history.

(56) References Cited

U.S. PATENT DOCUMENTS 6,728,936 B1 * 4/2004 Watkins .................. 716/2
6,807,652 B2 * 10/2004 McConaghy ............. 716/2
6,957,400 B2 * 10/2005 Liu et al. ................. 716/1
7,493,574 B2 * 2/2009 Liu et al. ................. 716/1

OTHER PUBLICATIONS

G. Gielen et al., "Computer Aided Design of Analog and Mixed-Signal Integrated Circuits", Proceedings Of The IEEE, Dec. 2000, vol. 88 No. 12, pp. 1825-1852.
Kalyanmoy Deb et al., "A Fast Elitist Non-dominated Sorting Genetic Algorithm for Multi-objective Optimization: NSGA-II", Proc. PPSN VI, Sep. 2000, pp. 849-858.
Jim X. Chen et al., "Data Visualization: Parallel Coordinates and Dimension Reduction", Computing in Science and Engineering, 2001, vol. 3 Issue 5, pp. 110-113.
"What is Process Capability", NIST/SEMATECH e-handbook of Statistical Methods, http://www.itl.nist.gov/div898/handbook/pmc/section1/pmc16.htm, Jul. 18, 2006, sec. 6.16.

* cited by examiner

*Primary Examiner*—Thuan Do
*Assistant Examiner*—Nghia M Doan
(74) *Attorney, Agent, or Firm*—Anne Kinsman; Borden Ladner Gervais LLP

(57) ABSTRACT

A system that includes a candidate generator that generates candidate vectors having as components performance specifications of an electrical circuit design. The system also includes a performance estimator that generates performance vectors of the electrical circuit design, the performance vectors having as components performance values of the electrical circuit design. The candidate vectors and the performance vectors are input into a statistical estimator that calculates a statistical parameter, for example, yield, for each candidate vector in accordance with the performance vectors. The system further includes a filter that receives the candidate vectors and their respective statistical parameters, and outputs a filtered candidate vector with its corresponding filtered statistical parameter. A display system visually represents the filtered candidate vector and its corresponding filtered statistical parameter.

19 Claims, 3 Drawing Sheets

| | Output Metric | Original Minimum | Original Maximum | Minimum | Maximum |
|---|---|---|---|---|---|
| 1 | AV | 33.0 | | 33.0 | |
| 2 | BW | 3.00 | | 3.00 | |
| 3 | CMRR | 55.0 | | 84.2 | |
| 4 | FU | 70.0 | | 70.0 | |
| 5 | GBW | 70.0 | | 117 | |
| 6 | GM | 10.0 | | 14.6 | |
| 7 | IS | | 5.65 | | 9.5 |
| 8 | OS | 75.0 | 720m | 75.0 | 1.24 |
| 9 | PM | 28.0 | | 28.0 | |
| 10 | PSRR | | 8.50 | | 8.50 |
| 11 | PWR | 17.2 | | 17.2 | |
| 12 | SR | | 48.0n | | 48.0n |
| 13 | ST | | -44.0 | | -44.0 |
| 14 | THD | 1.45 | | 1.45 | |
| 15 | VOH | | 50.0m | | 50.0m |
| 16 | VOL | | | | |

30

Select amount to adjust specification: Looser — Tighten

Plot Tradeoff Candidates | Reset Selected | Reset All

Figure 2

SYSTEM AND METHOD FOR DETERMINING AND VISUALIZING TRADEOFFS BETWEEN YIELD AND PERFORMANCE IN ELECTRICAL CIRCUIT DESIGNS

This application claims the benefit of priority of U.S. Provisional Patent Application No. 60/807,893 filed Jul. 20, 2006, which is incorporated herein by reference. The applicant acknowledges the participation of K.U. Leuven Research and Development in the development of this invention.

FIELD OF THE INVENTION

The present invention relates generally to tradeoffs between yield and performance in design and manufacturing. More particularly, the present invention relates to methods of determining and displaying tradeoffs between yield and performance in semiconductor circuit design and layout.

BACKGROUND OF THE INVENTION

The yield and performance of analog, mixed-signal, and custom digital circuits are both very important since they directly affect the profitability of the chips containing these circuits. The yield referred to above here is the manufacturing yield, i.e., the number of manufactured chips meeting pre-determined performance criteria.

Product managers for semiconductor chip design often base decisions for the specific design of a product based on trading off performance for an increased manufacturing yield. As an example, a design for an integrated circuit may have an op-amp designed for a 70 dB gain, but the yield of the design may only be 60%. In contrast, by decreasing the gain's specification to 60 dB, the yield may increase to 90%. When the product manager examines the tradeoff, the ultimate objective is to increase the profitability of the design. On one hand, a higher performance product may be able to command a price premium, but if the yield is not sufficient, the required price may be too high for the market to bear. On the other hand, a reduction in performance may result in a reduced ability to command a price premium, but with a higher yield, the cost per item can be reduced.

To perform tradeoff analysis, a product manager typically uses a spreadsheet populated with data relating to performance specifications and manufacturing yield of a given design. When working with more than two or three specifications, such an analysis can easily become tedious and time-consuming, in particular when loosening some specifications may not actually lead to an increase in yield. Even though the manager is not interested in these dead end cases, he still has to address them.

Manufacturing yield data for various possible performance points of a design can come from different places, including actual data obtained from analysis of manufacturing yield specific to, for example, a particular fabrication facility, after the design is manufactured. This is the data that product engineers are most concerned with. Another source of manufacturing yield data can be found in circuit simulation data. This is usually a cheaper but less accurate source of yield data. The data is obtained by estimating the yield numbers by hand calculation or, more commonly, by circuit simulation, often in combination with back-end tools, such as layout tools performing critical-area analysis.

One of the simplest ways to calculate yield data is through Monte-Carlo circuit simulations followed by computation of the ratio of feasible samples vs. the total number of samples. Other estimates exist, such as those based on density estimation from Monte Carlo simulation data, or by using regression models. A yield estimate via circuit simulation is typically used by front and back end circuit designers during circuit design. Product engineers find this information useful as well because it adds highlights possible yield-related issues earlier in the design flow. Accordingly, both designers and product engineers are required to manage tradeoff between yield and specifications.

If there are a limited number of variables in the system, a designer can modify the variables and achieve an acceptable degree of optimization. However, due to the interconnected nature of designs, as the number of variables increases, the number of choices regarding design, yield, and performance for a designer increases exponentially. This results in information overload that renders optimization very difficult and impedes the evaluation process. Ultimately, such situations tend to result in a heavy reliance upon a designer's intuition, which is not desired for large-scale modern designs.

There are many instances where the design is already fixed, such as when the chip has already been fabricated. But despite being fixed, there is still opportunity to trade off yield with performance for the chip in question. That is, there is a need to measure the performance of the manufactured chips and to determine the yield with respect to different performance specifications. Someone (the designer, the product manager, or someone else) needs to make a decision on how to balance performances with yield in order to, for example, select price points for the manufactured chips.

It is, therefore, desirable to provide a system and method that provide better visibility into possible tradeoffs between performance specifications and yield values for a given electrical circuit design while it is still in the design stage. It is also desirable to provide a system and method that provide better visibility into possible tradeoffs between performance and yield for fixed designs such as already-manufactured chips.

SUMMARY OF THE INVENTION

It is an object of the present invention to obviate or mitigate at least one disadvantage of previous tools and methods used in determining tradeoffs between yield and performance in circuits that are still at the design stage, or at later stages such as electrical test.

In a first aspect, the present invention provides a system for evaluating tradeoff between a statistical parameter and performance for an electrical circuit design (ECD). The system comprises a candidate generator for providing specification candidate vectors for the ECD, each specification candidate vector having a plurality of performance specifications of the ECD. Further, the system comprises a performance estimator for providing performance vectors for the ECD, each performance vector having a plurality of performance values of the ECD, each performance value having a counterpart performance specification. Further yet, the system comprises a statistical estimator for receiving the specification candidate vectors and the performance vectors, and for calculating the statistical parameter for at least one specification candidate vector in accordance with pre-determined calculations based on the at least one specification candidate vector and the performance vectors. Additionally, the system comprises a filter for receiving the at least one specification candidate vector and its respective statistical parameter, and for filtering the at least one specification candidate vector in accordance with pre-determined criteria to produce at least one filtered specification candidate vector with its respective statistical parameter; and a display system for visually representing the at least one filtered specification candidate vector and its respective statistical parameter.

The predetermined criteria can specify a selection of the at least one filtered specification candidate vector whose statistical parameter and performance specifications are non-dominated by those of another specification candidate vector. The statistical parameter can be one of an overall yield, a partial yield associated with a specific circuit performance, a standard deviation of the specific circuit performance, a standard deviation of the specific circuit performance, a process capability (Cp) of the specific circuit performance, and an overall process capability (Cpk).

The system can further comprise additional statistical estimators, each for receiving the specification candidate vectors and the performance vectors, and each for calculating an additional statistical parameter for the at least one specification candidate vector in accordance with additional pre-determined calculations based on the at least one specification candidate vector and the performance vectors. The filter can further be for receiving each additional statistical parameter and for filtering the at least one specification candidate vector in accordance with additional pre-determined criteria to produce additional filtered specification candidate vectors with their respective statistical parameters. The display system can further be for visually representing the additional filtered specification candidate vector and their respective statistical parameters. The pre-determined criteria and the additional pre-determined criteria can include at least one of: non-dominated filtering criteria, clustering criteria, k-optimality filtering criteria, and fuzzy non-dominated filtering criteria.

The system can further comprise a user input module operatively connected to the display system, the user input module for enabling a user to select a filtered specification candidate for export to a circuit design program.

The display system can include a graphing engine for visually representing the at least one selected specification candidate vector graphically. The graphing engine can include at least one of: polar plot graphing capabilities and parallel coordinates plotting capabilities. The performance estimator can include performance vectors obtained from an ECD fabrication facility. The performance estimator can include performance vectors obtained from an ECD fabrication facility. The statistical simulator can include at least one of a Monte Carlo simulator, a regression analysis engine and a density estimator.

In a second aspect, the present invention provides a method of presenting tradeoffs between a statistical parameter and performance for an electrical circuit design (ECD). The method comprises steps of generating a set of specification candidate vectors based on the ECD, each specification candidate vector having performance specifications based on the ECD and generating performance vectors for the ECD, each performance vector having performance values associated with parameters of the ECD. Further, the method comprises steps of calculating the statistical parameter for at least one specification candidate vector in accordance with pre-determined calculations based on the at least one specification candidate vector and the performance vectors and filtering the at least one specification candidate vector in accordance with pre-determined criteria to produce at least one filtered specification candidate vector with its respective statistical parameter. Further yet, the method comprises a step of displaying the at least one filtered specification candidate vectors and its respective statistical parameter.

The step of generating performance vectors can include providing performance vectors obtained from an ECD fabrication facility. The step of generating performance vectors can also include using a simulator to generate the performance vectors. In this case, the simulator can include at least one of a Monte Carlo simulator, a regression analysis engine and a density estimator simulator.

The step of calculating the statistical parameter can include calculating at least one of an overall yield, a partial yield associated with a specific circuit performance, a standard deviation of the specific circuit performance, a standard deviation of the specific circuit performance, a process capability (Cp) of the specific circuit performance, and an overall process capability (Cpk).

The pre-determined criteria can include at least one of: non-dominated filtering criteria, clustering criteria, k-optimality filtering criteria, and fuzzy non-dominated filtering criteria.

The step of displaying the filtered specification candidate vectors can include graphically representing each of the filtered specification candidate vectors in at least one of a two-dimensional scatter plot, a three-dimensional scatter plot, a radar plot, a parallel coordinates plot and a list.

The method can further comprise steps of selecting a filtered specification candidate and exporting the selected filtered specification candidate to a circuit design program.

Other aspects and features of the present invention will become apparent to those ordinarily skilled in the art upon review of the following description of specific embodiments of the invention in conjunction with the accompanying Figures.

BRIEF DESCRIPTION OF THE DRAWINGS

Embodiments of the present invention will now be described, by way of example only, with reference to the attached drawings, wherein:

FIG. 2 is an illustration of an interface for providing parameters to an optimization process.

DETAILED DESCRIPTION

Generally, the present invention provides a method and system for evaluating a statistical parameter such as, for example, yield, as a function of performance for different performance characteristics of an electrical circuit design.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Figure 1:
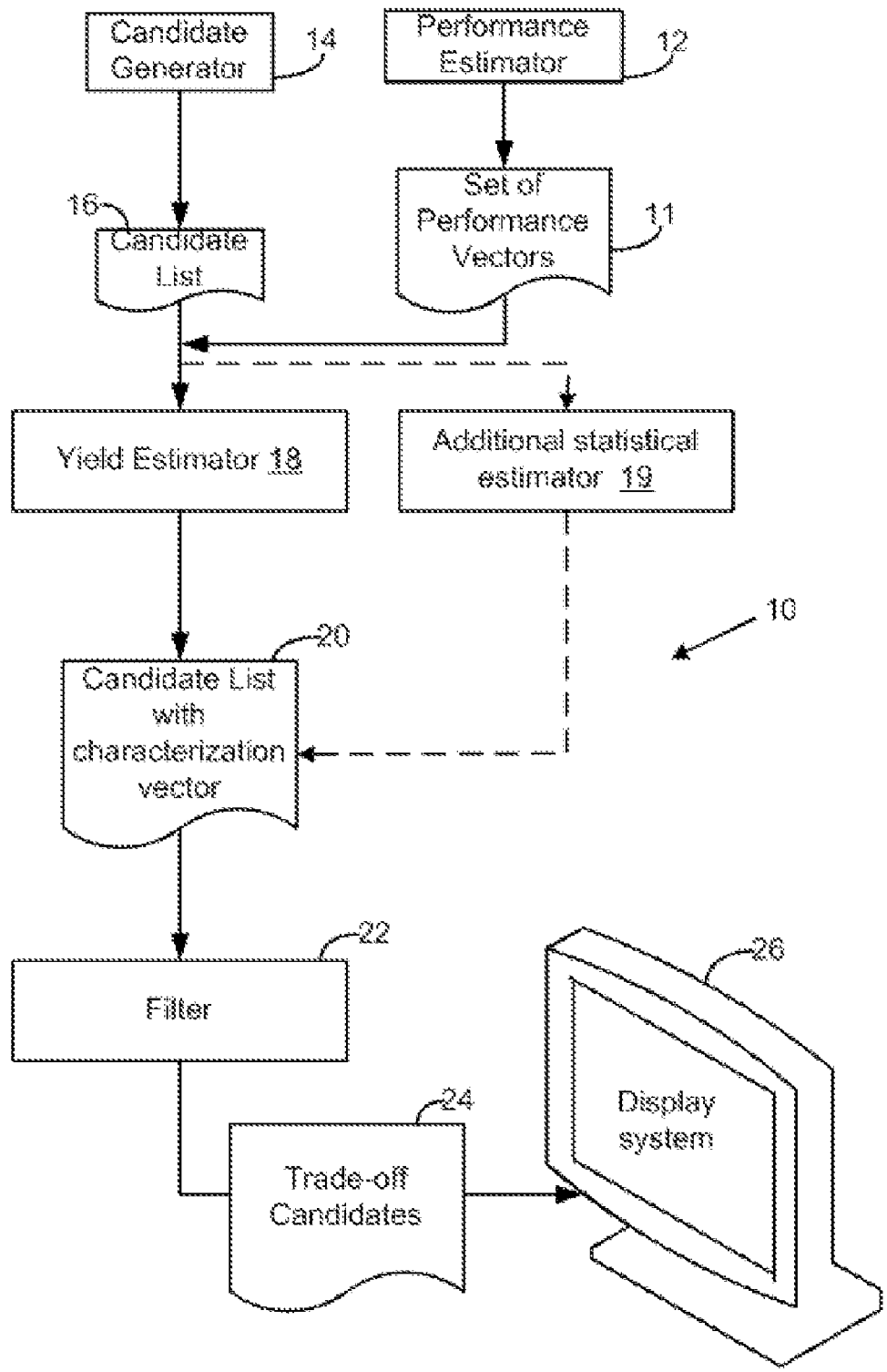
FIG. 1 is a block diagram illustrating a system of the present invention.

A single design, i.e., a point in a circuit design space, can have many tradeoff candidates because of the statistical nature of yield vs. performance specifications related to the circuit design in question. For example, the same circuit design might have a set of three tradeoff candidates in the tradeoff of open loop gain vs. yield: {(70 dB, 10% yield), (65 dB, 30% yield), (60 dB, 62% yield)}. The present invention provides a system and method for presenting a defined subset of such tradeoff candidates to simplify and automate the tradeoff candidate selection process. FIG. 1 illustrates such an exemplary system of the present invention at reference numeral 10.

An input to the system 10 is a set of performance vectors 11 provided by a performance estimator 12. Each performance vector comprises a number of performance values associated with parameters of an electrical circuit design. Each performance vector can come from, e.g., different computed random instances of the design in question such as those found from doing Monte Carlo sampling. To illustrate, an op amp circuit design will have associated with it a plurality of op-amp performance goals such as power consumption gain, slew rate etc. It is these distinct performance goals (or values) that make up a performance vector. Typical randomness effects that comprise manufacturing variation include: varying thicknesses of an oxide layer present in the circuit design; varying widths between conductor lines; varying resistivities of a metal layer; etc. Of course, the choice of which parameters to vary, and in what range, will usually be informed by the historical output of a given manufacturing plant. To obtain such performance vectors, the performance estimator can run circuit simulations programs such as, e.g., SPICE, or any other suitable simulation software. Alternatively, the performance estimator can contain performance vectors obtained from measurements on manufactured semiconductor chips in which case the random instances are the actual dies produced. For example, a designed circuit can be manufactured with 1,000 dies of the design produced. Each die, or a subset of dies, can have its performances measured with test equipment. The performances, which are not expected to be identical due to manufacturing variations, are then stored in the performance estimator 12. In another approach, one can simulate the manufacture of chips via Monte Carlo simulation sampling which draws random points from a probability density function that approximates the effects of manufacturing variation, followed by computing the performance vector for each random instance. One can also generate a set of performance vectors from a regression model, which is likely faster to generate than by using a SPICE approach, but possibly less accurate. Performance vectors may be modified or aggregated performance vectors. For example, the performance vectors may be modified or aggregated to describe the worst case across all possible operating conditions for the circuit design in question.

A random instance of a design is only considered feasible if each of its performance values meets the corresponding performance specifications. Accordingly, another input in the system 10 is a specification candidate list 16 provided by a specification candidate generator 14 shown at FIG. 1. The candidate generator 14 generates candidate vectors for a given design, each candidate vector having a series of candidate performance specifications. The candidate generator 14 creates a set of possible combinations of the candidate performance specifications, each combination defining a distinct candidate vector. The possible combinations can be defined by the designer who will generally have a good sense of the expected values for a given performance of an circuit design. For instance, if the expected value of gain for an op-amp of the circuit design is 10 dB and is expected to be no lower than 3 dB and no higher than 16 dB, the designer could choose to parse the 4 dB to 16 dB range in 2 dB increments. These eight values (2, 4, 6, 8, 10, 12, 14 and 16 dB) would be combined with other similar values related to other op-amps (or other components) to produce the specification candidate vectors. As a further example, there may be three performance specifications, each with a range spanning from 0.0 to 10.0. A designer can choose to generate, for example, six different uniformly spaced performance specification thresholds for each of the performance specifications, i.e., each performance specification would be broken up into six thresholds: [0.0, 2.0, 4.0, 6.0, 8.0, 10.0]. The candidate generator 14 would then consider all combinations of specifications, i.e., in this example, a total of 6×6×6=616 specifications would be generated. FIG. 2 illustrates an exemplary interface display 30 that enables the user to configure the desirable ranges for each specification. The candidate vectors are shown as candidate list 16. The candidate vectors can be obtained in more complicated ways. Another example method to generate the candidate methods is as follows: for each performance the system creates a list of possible specification threshold values which are a full set or subset of the values observed for that performance; then the cross product of these are generated as usual. For example if the observed values of gain were [57.1 60.2, 60.3 60.4 60.9 61.8 62 63 64] dB and for power consumption were [10, 11.1 11.2 11.3, 12, 13, 14] mW then the system may create the cross product of [57.1 60.2, 60.9 61.8 62 64]×[10, 11.1 12 14] as its set of candidate specification vectors.

Continuing with FIG. 1, a yield estimator 18 is used to calculate the yield for each candidate vector, in view of the whole set of performance vectors. This can be done using different statistical approaches. A simple way to calculate yield for each candidate vector would be to count the number of performance vectors that meet the specifications of the candidate vector in question and to divide this number by the total number of performance vectors. Another way would be to build a density model from the set of performance vectors and then integrate across the density model for the region bounded by a given candidate performance specification vector. The yield estimator 18 outputs a candidate list with characterization vectors 20, each vector including all the entries for a performance specification vector, plus the yield associated with that performance specification vector. As will be understood by a worker skilled in the art, the yield estimator 18 can be substituted with any other suitable type of statistical estimator and, any number of such statistical estimators can be used in parallel to produce distinct statistical parameters. An example of such an additional statistical estimator is shown at reference numeral 19.

The candidate list with characterization vectors 20 is filtered by a filter 22, which can be a non-dominated filter, the meaning of which is to be understood as follows. Certain characteristic vectors can be considered as dead ends if they are "dominated". For example, candidate A "dominates" candidate B if candidate A is the same or better than B for all dimensions, i.e., better performance specification or yield, and if candidate A is better than B for at least one dimension. "Non-dominated" characteristic vectors are simply the ones that are not dominated. These non-dominated characteristic vectors are often referred to as "tradeoff candidates". In the case where the filter 22 is a non-dominated filter, the output of the filter 22 is a list of non-dominated tradeoff candidates 24.

Figure 3:
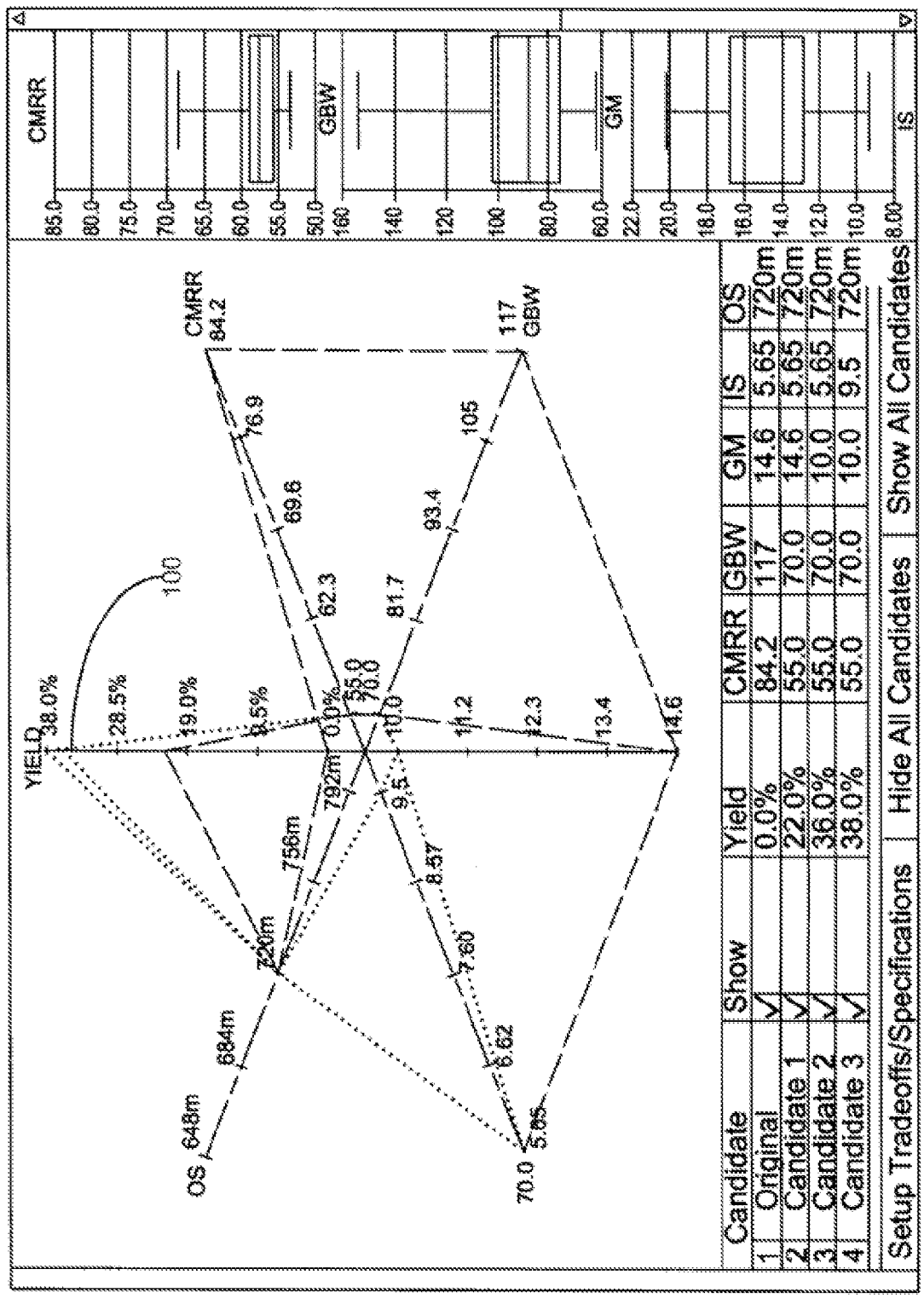
FIG. 3 is an illustration of a tradeoff plot of specifications.

In one embodiment of the present invention, the non-dominated tradeoff candidates 24 are displayed in a graphical representation on display 26. The graphical representation of the design characteristics can be provided in any of a number of ways. For instance, when the characteristic vector has only two elements, e.g., a performance specification with an associated yield, a two-dimensional scatter plot can be used. For three elements, a 3-dimensional scatter plot can be used. However, in instances where the characteristic vector has more than three elements and thus more dimensions, other representations can be used including, for example, (a) displaying only three dimensions at a time, and allowing the viewer to select the illustrated dimensions in an interactive plot, and (b) multidimensional visualization such as radar plots. FIG. 3 shows an example of a radar plot where specifications are traded off with yield for an op amp design. In the radar plot shown, each axis corresponds to either a performance specification or a statistical estimate. On each axis, closer to the center means "worse" and farther away from the center means "better." A candidate tradeoff has one entry on each axis, and can be represented by a set of line segments joined in each axis. A terrible candidate would be a set of short line segments that all connect in closed polygon very close to the center. A perfect candidate would have long line segments connecting from the tip of each axis to the tip of the next axis; but of course such a perfect candidate does not exist, i.e. there are tradeoffs between performances and yield. For example, one of the candidates in FIG. 3 has a better yield than most (38%, see axis 100), but its other performances are worse than ideal indicated by their polygon of line segments connecting to the 38% yield which are not in the edges of the axes. In contrast, the design with best CMRR (see axis going right from center) has to heavily compromise yield.

Additionally, an interactive interface, such as shown at reference numeral 30 at FIG. 2 can be used to provide the user of the design tool the ability to explore the tradeoffs in more detail. The radar plot of FIG. 3 can also be made interactive, through any suitable means, to explore such tradeoffs. This provides the user with the ability to tighten and loosen possible yield specifications or design parameters (FIG. 2). The user can remove uninteresting tradeoff candidates, or color (or otherwise visually highlight) interesting candidates (FIG. 3). Or, the user can select a tradeoff candidate, and export its values for use elsewhere (FIG. 3). For example, the specification values may be used for a new yield optimization run, or for a new circuit characterization. Further, the user could use initial tradeoff results to choose a tighter bounding box of specifications, and generate new tradeoffs that can "zoom in" on a performance-specification region of interests. This tuning of the tradeoff candidates can be repeated after each run of the yield estimator.

A specific embodiment of this invention can be used in a sensitivity analysis of performance specifications. In such a sensitivity analysis, the candidate performance specification vectors in the list 16 are generated with sensitivity-analysis style sampling, i.e., they are perturbed by small values around a central performance specification vector. Then, the yields associated with these specification vectors are computed as usual. The filter 22 may be programmed to do nothing, if the user is interested in the sensitivity to specifications or, if only the tradeoffs are required, the filter 22 may do non-dominated filtering. Alternatively, the filter 22 can do other types of filtering such as (a) k-optimality filtering, which sorts non-dominated results even more strongly: it counts the number of dimensions that one point dominates another point; (b) fuzzy nondominated filtering in which one the membership of the term "dominates" is not black and white, but instead allows for varying degrees of membership: point A might dominate point B with a membership of 0.8 (rather than 1.0); (c) clustering down results so that there are fewer results; and (d) any other means of creating a subset of the larger set of candidate points in which the subset-creating step is interesting to a designer, where usually "interesting" involves some sort of tradeoff. Visualization of the results may be one of the visualizations discussed; or it may be simply a plot that shows the magnitude of change in yield for each specification change and/or direction of change.

Each modification of a component in the design can be considered as a design candidate. As mentioned previously, each design candidate can actually generate its own set of tradeoff candidates through sensitivity-analysis sampling. This type of sampling only needs to be generalized slightly in order to take into account different design candidates. Further, there are different options to generalize that type of sampling to take multiple designs into account. One simple generalization is as follows. For each design candidate, compute the set of candidate vectors, then merge all the candidate vectors together and follow the rest of the design flow as usual, i.e., apply non-dominated filtering, etc. Another way to generalize is to incorporate the approach into an optimization scheme, where an optimizer (not shown) generates candidate designs. Each candidate design point has multiple tradeoff candidates and the optimizer takes the multiple tradeoff candidates into account in its decision-making. The optimizer would typically be a multi-objective optimizer. This allows the circuit designer to make decisions early in the design process and to include fabrication limitations to make the final design better suited to the optimization process described above.

In the embodiments above, "yield" was the single overall aggregating statistical measure. However, it is possible to consider other aggregating statistical measures as well. That is, there can be one or more statistical aggregating measures in a characterization vector. These additional statistical aggregating measures can include, for example: the partial yield for each performance specification, or the average value across all random instances for each performance specification; the standard deviation for each performance specification; the Cp ("process capability") for each performance specification; the overall Cpk, e.g., the minimum Cp value from across all performance specifications. For example, a user could choose from a set of tradeoff candidates, each candidate having its own way of trading off among different performance specifications, yield, and Cpk; i.e. if there were performances of "gain" and "slew rate", then the overall dimensions for the tradeoff could be: gain specification slew rate specification yield, and Cpk.

The system and method of the present invention, as described above, can be viewed as being statistically aware in that they are based on statistical modeling of either the actual fabrication process or of a simulation of the process. There exist other design tools for evaluating tradeoffs, but these tools have typically been statistically unaware, and thus cannot be used for evaluation of fabrication yield. Existing tools generate displayed data based on multi-objective optimization of a design based solely on the parameters of the design. By failing to account for external factors, such as fabrication statistics, these existing tools cannot, contrary to embodiments of the present invention:

(a) account for a single design point that can generate a large set of possible tradeoffs based on its own values (a multi-objective optimization would view the single design point as a single tradeoff value);

(b) manage a performance evaluation based on specifications instead of actual values; and (c) function without an optimization to generate the tradeoff, whereas the system and method of the present invention can generate a tradeoff based on any provided design with the appropriate yield estimation information.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

As described above, the present invention provides a method and system for evaluating a statistical parameter such as, for example, yield, as a function of performance for different performance characteristics of an electrical circuit design.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A system for evaluating tradeoff between a statistical parameter and performance for an electrical circuit design (ECD), the system comprising:
    a candidate generator for providing candidate vectors for the ECD, each candidate vector having as components a plurality of performance specifications of the ECD;
    a performance estimator for providing performance vectors for the ECD, each performance vector having as components a plurality of performance values of the ECD, each performance value having a counterpart performance specification;
    a statistical estimator for receiving the candidate vectors and the performance vectors, and for calculating the statistical parameter for at least one candidate vector in accordance with pre-determined calculations based on the at least one candidate vector and the performance vectors;
    a filter for receiving the at least one candidate vector and its respective statistical parameter, and for filtering the at least one candidate vector in accordance with pre-determined criteria to produce at least one filtered candidate vector with its respective statistical parameter; and
    a display system for visually representing the at least one filtered candidate vector and its respective statistical parameter.

2. The system of claim 1 wherein the predetermined criteria specify a selection of the at least one filtered candidate vector whose statistical parameter and performance specifications are non-dominated by those of another candidate vector.

3. The system of claim 1 wherein the statistical parameter is one of an overall yield, a partial yield associated with a specific circuit performance, a standard deviation of the specific circuit performance, a standard deviation of the specific circuit performance, a process capability (Cp) of the specific circuit performance, and an overall process capability (Cpk).

4. The system of claim 1 further comprising additional statistical estimators, each for receiving the candidate vectors and the performance vectors, and each for calculating an additional statistical parameter for the at least one candidate vector in accordance with additional pre-determined calculations based on the at least one candidate vector and the performance vectors wherein, the filter is further for receiving each additional statistical parameter and for filtering the at least one candidate vector in accordance with additional pre-determined criteria to produce additional filtered candidate vectors with their respective statistical parameters, the display system further for visually representing the additional filtered candidate vector and their respective statistical parameters.

5. The system of claim 1 further comprising a user input module operatively connected to the display system, the user input module for enabling a user to select a filtered candidate vector for export to a circuit design program.

6. The system of claim 4 wherein the pre-determined criteria and the additional pre-determined criteria include at least one of: non-dominated filtering criteria, clustering criteria, k-optimality filtering criteria, and fuzzy non-dominated filtering criteria.

7. The system of claim 1 wherein the display system includes a graphing engine for visually representing the at least one selected candidate vector graphically.

8. The system of claim 7 wherein the graphing engine includes at least one of: polar plot graphing capabilities and parallel coordinates plotting capabilities.

9. The system of claim 1 wherein the performance estimator includes performance vectors obtained from an ECD fabrication facility.

10. The system of claim 1 wherein the performance estimator includes a statistical simulator for generating performance vectors of the ECD based on a fabrication model.

11. The system of claim 10 wherein the statistical simulator includes at least one of a Monte Carlo simulator, a regression analysis engine and a density estimator.

12. A tangible computer-readable medium having recorded thereon statements and instructions for execution by a computer of a method of presenting tradeoffs between a statistical parameter and performance for an electrical circuit design (ECD), the method comprising steps of:
    generating a set of candidate vectors based on the ECD, each candidate vector having as components performance specifications based on the ECD;
    generating performance vectors for the ECD, each performance vector having as components performance values associated with parameters of the ECD;
    calculating the statistical parameter for at least one candidate vector in accordance with pre-determined calculations based on the at least one candidate vector and the performance vectors;
    filtering the at least one candidate vector in accordance with pre-determined criteria to produce at least one filtered candidate vector with its respective statistical parameter; and
    displaying the at least one filtered candidate vectors and its respective statistical parameter.

13. The tangible computer-readable medium of claim 12 wherein the step of generating performance vectors includes providing performance vectors obtained from an ECD fabrication facility.

14. The tangible computer-readable medium of claim 12 wherein the step of generating performance vectors includes using a simulator to generate the performance vectors.

15. The tangible computer-readable medium of claim 14 wherein the simulator includes at least one of a Monte Carlo simulator, a regression analysis engine and a density estimator simulator.

16. The tangible computer-readable medium of claim 12 wherein calculating the statistical parameter includes calculating at least one of an overall yield, a partial yield associated with a specific circuit performance, a standard deviation of the specific circuit performance, a standard deviation of the specific circuit performance, a process capability (Cp) of the specific circuit performance, and an overall process capability (Cpk).

17. The tangible computer-readable medium of claim 12 wherein the pre-determined criteria include at least one of: non-dominated filtering criteria, clustering criteria, k-optimality filtering criteria, and fuzzy non-dominated filtering criteria.

18. The tangible computer-readable medium of claim 12 wherein the step of displaying the filtered candidate vectors includes graphically representing each of the filtered candidate vectors in at least one of a two-dimensional scatter plot, a three-dimensional scatter plot, a radar plot, a parallel coordinates plot and a list.

19. The tangible computer-readable medium of claim 12 further comprising steps of:
    selecting a filtered candidate vector; and
    exporting the selected filtered candidate vector to a circuit design program.

* * * * *